(12) United States Patent
Choe et al.

(10) Patent No.: US 8,068,159 B2
(45) Date of Patent: Nov. 29, 2011

(54) IMAGE CAPTURING DEVICE AND METHOD WITH INFRARED DETECTION THORUGH PLURAL FILTER REGIONS

(75) Inventors: Won-hee Choe, Gyeongiu-si (KR); Jae-Hyun Kwon, Yongin-si (KR); Seong-deok Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 878 days.

(21) Appl. No.: 11/785,560

(22) Filed: Apr. 18, 2007

(65) Prior Publication Data

US 2007/0273781 A1    Nov. 29, 2007

(30) Foreign Application Priority Data

May 26, 2006   (KR) .................. 10-2006-0047795

(51) Int. Cl.
   *H04N 3/14*       (2006.01)
   *H04N 5/335*      (2011.01)
(52) U.S. Cl. .................. 348/311; 348/218.1; 348/272
(58) Field of Classification Search .................. 348/218, 348/272–280; 250/214.1
   See application file for complete search history.

(56) References Cited

U.S. PATENT DOCUMENTS

| 5,914,749 | A  |   | 6/1999 | Bawolek et al. |         |
|-----------|----|---|--------|----------------|---------|
| 5,929,432 | A  |   | 7/1999 | Yamakawa       |         |
| 7,274,393 | B2 | * | 9/2007 | Acharya        | 348/273 |
| 2004/0169749 | A1 |   | 9/2004 | Acharya |         |
| 2005/0134697 | A1 |   | 6/2005 | Mikkonen et al. |     |
| 2006/0017829 | A1 | * | 1/2006 | Gallagher | 348/276 |
| 2006/0066738 | A1 |   | 3/2006 | Hershey et al. |      |
| 2006/0124833 | A1 | * | 6/2006 | Toda | 250/214.1 |
| 2009/0268043 | A1 | * | 10/2009 | Olsen et al. | 348/218.1 |

FOREIGN PATENT DOCUMENTS

| EP | 1 594 321 A2 | 11/2005 |
| EP | 1 630 871 A1 | 3/2006 |
| JP | 3-114388 | 5/1991 |
| JP | 2002-142228 | 5/2002 |
| JP | 2004-304706 | 10/2004 |
| JP | 2005-6066 | 1/2005 |
| WO | 99/50682 | 10/1999 |
| WO | 00/57651 | 9/2000 |

OTHER PUBLICATIONS

Japanese Office Action Mailed Aug. 25, 2009 corresponds to Japanese Patent Application No. 2007-134324.
Cover Page of EP 1594321 A3 with corresponding European Search Report Oct. 2007.
European Search Report issued Oct. 23, 2007 in corresponding European Patent Application No. 07108758.9-2202.

* cited by examiner

*Primary Examiner* — Gevell Selby
(74) *Attorney, Agent, or Firm* — Staas & Halsey LLP

(57) ABSTRACT

An image capturing device and method, with the image capturing device including a lens, a filter unit, and an image sensor unit. The filter unit has a first filter region which limits incident light, having passed through the lens, to primary color light, a second filter region which passes the incident light in all wavelength ranges, and a third filter region which limits light in an infrared wavelength range. The image sensor unit senses an image using light passing through the filter unit. Thereby, the ability to sense an image can be improved.

29 Claims, 5 Drawing Sheets

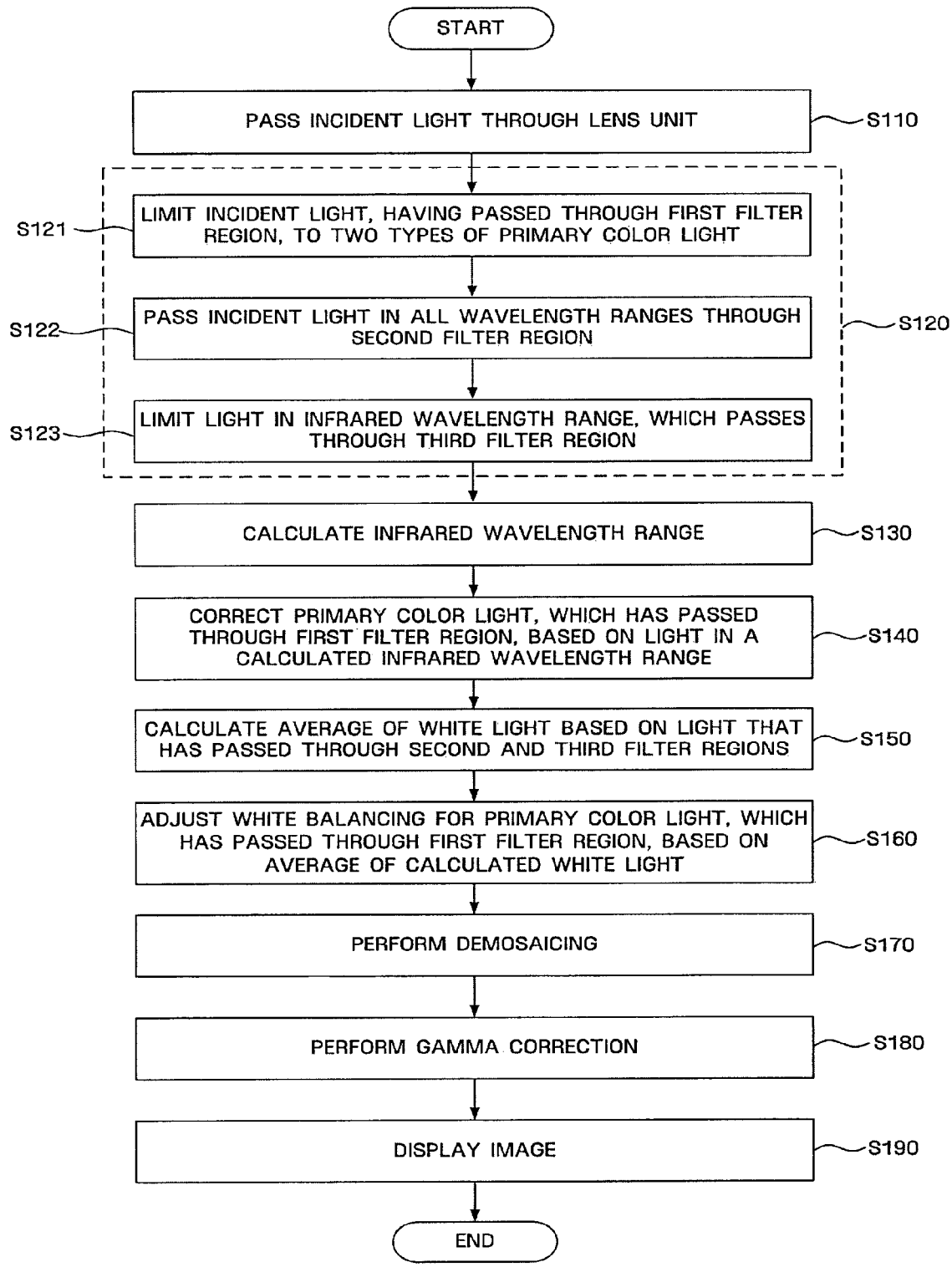

IMAGE CAPTURING DEVICE AND METHOD WITH INFRARED DETECTION THORUGH PLURAL FILTER REGIONS

CROSS-REFERENCE TO RELATED APPLICATIONS

This application claims priority from Korean Patent Application No. 10-2006-0047795 filed on May 26, 2006 in the Korean Intellectual Property Office, the disclosure of which is incorporated herein by reference in its entirety.

BACKGROUND OF THE INVENTION

1. Field of the Invention

One or more embodiments of the present invention relate to an image capturing device and method and, more particularly, to an image capturing device and a method that can improve the ability to sense an image.

2. Description of the Related Art

Recently, it has become popular for differing devices to be equipped with high-resolution cameras, such as personal digital assistants, digital cameras, and camera phones. Such devices with a camera typically include a lens and an image sensor.

Here, the lens is responsible for condensing light reflected from a subject, and the image sensor is responsible for sensing light condensed by the lens and converting the sensed light into electrical image signals. The image sensor can be classified as an image pickup tube or a solid-state image sensor, with representative examples of the solid-state image sensor including a Charge Coupled Device (CCD) and a Complementary Metal Oxide Semiconductor (CMOS).

Furthermore, in such a camera, the image sensor may include a Color Filter Array (CFA), that is, an arrangement of color filters corresponding to respective pixels. An infrared blocking filter is formed on the CFA in order to prevent a change in the color of an image attributable to the infrared sensitivity of the image sensor.

In this case, the infrared blocking filter, the color filter array, and the image sensor are integrated into a single module, and the infrared blocking filter is formed so as to be spaced apart from the image sensor by a predetermined distance.

Meanwhile, with this arrangement, a problem occurs in that the ability to sense a captured image decreases rapidly when the size of a Contact Image Sensor (CIS) does not increase as the number of effective pixels increases. An increase in the number of pixels for a CIS having a limited size means that the density of image sensors in the CIS increases. Consequently, the amount of light that reaches each pixel actually decreases.

Japanese Unexamined Pat. Application No. 2004-304706 discusses a solid-state pickup and processing device, in which, in green, blue, red, and white filter segments, white filters are disposed in top, bottom, left and right directions with respect to the green color. However, this solid-state pickup device relates to a technology for ensuring the amount of signal charge and resolution and improving color reproduction capability, despite the reduction in the size of pixels, and does not prevent the above problems of decreases in the ability to sense an image, as attributable to the decreased size of the pixels.

SUMMARY OF THE INVENTION

Accordingly, the present invention has been made keeping in mind the above conventional problems, with an aspect of one or more embodiments of the present invention being to provide an image capturing device and method that can prevent a decrease in the ability to sense an image even when pixels are reduced in size and/or the density of the pixels increases without equally increasing the size of the image capturing device.

Additional aspects and/or advantages of the invention will be set forth in part in the description which follows and, in part, will be apparent from the description, or may be learned by practice of the invention.

To achieve the above and/or other aspects and advantages, embodiments of the present invention may include an image capturing device, including a lens to control incident light, a filter unit having a first filter region to limit the incident light, after passing through the lens, to visually observable color light, a second filter region to pass the incident light in wavelength ranges at least beyond the visually observable color light, and a third filter region to limit the incident light in an infrared wavelength range, and an image sensor unit to sense an image based on light modified by the filter unit.

To achieve the above and/or other aspects and advantages, embodiments of the present invention may include an image capturing device, including a filter unit having a first filter region to limit incident light to visually observable color light, a second filter region to pass the incident light in wavelength ranges at least beyond the visually observable color light, and a third filter region to limit the incident light in an infrared wavelength range, and an image sensing unit to compare a filtered result of the third filter region with at least one filtered result of the first filter region and a filtered result of the second filtered region to output an image with increased luminance over an image generated by only filtered results of the first filtered region.

To achieve the above and/or other aspects and advantages, embodiments of the present invention may include an image capturing method, including filtering light incident to a first filter region to limit incident light to visually observable color light, a second filter region to pass the incident light in wavelength ranges at least beyond the visually observable color light, and a third filter region to limit light in an infrared wavelength range, and sensing an image based on filtered results of the first, second, and third filter regions.

To achieve the above and/or other aspects and advantages, embodiments of the present invention may include an image capturing method, including filtering an incident light, including limiting incident light to visually observable color light by a first filter region, passing the incident light in wavelength ranges at least beyond the visually observable color light by a second filter region, and limiting the incident light in an infrared wavelength range by a third filter region, and generating and outputting an observed image by comparing a filtered result of the third filter region with at least one filtered result of the first filter region and a filtered result of the second filtered region, with the generated observed image having an increased luminance over an image generated by only filtered results of the first filtered region.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 4 illustrates an image capturing method, according to an embodiment of the present invention.

DETAILED DESCRIPTION OF THE PREFERRED EMBODIMENTS

Figure 1:
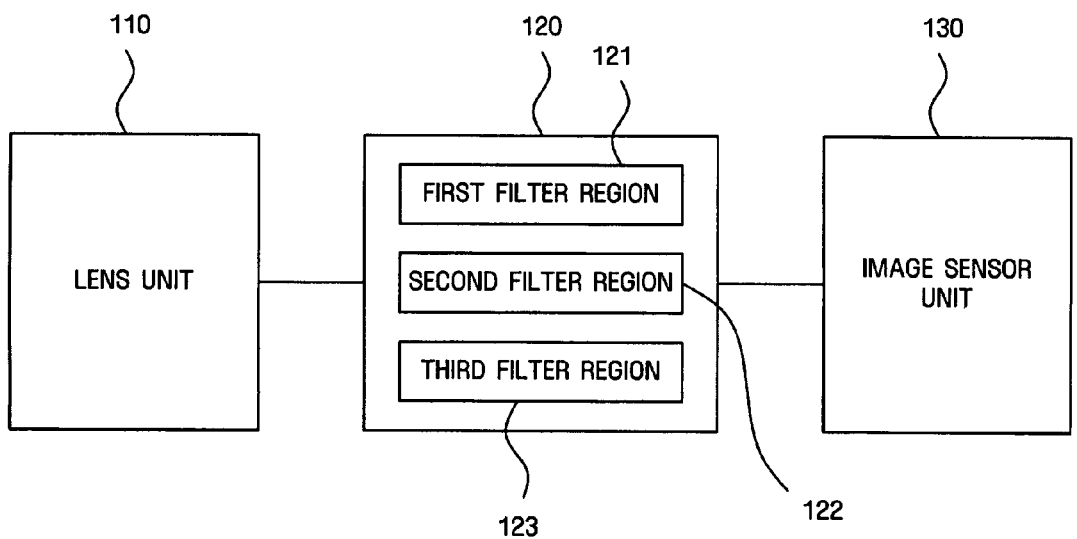
FIG. 1 illustrates an image capturing device, according to an embodiment of the present invention.

Reference will now be made in detail to embodiments of the present invention, examples of which are illustrated in the accompanying drawings, wherein like reference numerals refer to the like elements throughout. Embodiments are described below to explain the present invention by referring to the figures.

FIG. 1 illustrates an image capturing device, according to an embodiment of the present invention.

As shown in FIG. 1, the image capturing device 100 may include a lens unit 110, a filter unit 120, and an image sensor unit 130.

In an embodiment, the image capturing device 100 may be included in a device that can store images of a specific subject using a solid-state image sensor, such as a CCD or a CMOS. Accordingly, such an image capturing device 100 may be a digital camera, camera phone, and Personal Digital Assistant (PDA), for example, noting that alternatives are equally available.

The lens unit 110 may include one or more lenses, each of which condenses incident light, for example, and the number of lenses may be changed according to the intended purpose and requirement therefor. Furthermore, depending on embodiment, the lenses may be disposed in the same plane in various arrangements, e.g., the lenses may be disposed in a transverse direction or a longitudinal direction in a line, or in a matrix form (row*column).

The filter unit 120 may perform filtering on the incident light, which is condensed by the lens unit 110, and may pass light having specific wavelength ranges therethrough. In an embodiment, the filter unit 120 may include a first filter region 121, which limits the incident light to primary color light, a second filter region 122, which passes the incident light in all wavelength ranges therethrough, and a third filter region 123, which limits light in an infrared wavelength range. Alternate arrangements are equally available.

The first filter region 121 may include primary color filters, which limit the incident light to primary color light, for example. In one such embodiment, the primary color filters include a red filter and a blue filter, which respectively limit the incident light to red light and blue light. Here, although an embodiment has been presented where the primary color filters include the red filter and the blue filter, this is only an example used to promote understanding of the present invention. The, embodiments of the present invention are not limited thereto. For example, another embodiment includes filters that limit the light incident on the primary color filters to primary color light, that is, at least two types of light selected from among red light, green light, and blue light, Although the second filter region 122 may include a white filter that passes the incident light in all wavelength ranges, embodiments of the present invention are not limited thereto. For example, the second filter region 122 may not include any filter, resulting in the second filter region 122 passing incident light in all wavelength ranges. Accordingly, through use of the additional light from the white filter, for example, the amount of light that reaches a predetermined pixel is increased and, thereby, the number of effective pixels for the existing CIS having a limited size is increased. Thus, the second filter region 122 can prevent a decrease in the ability to sense an image due to the decrease in the amount of light that reaches each pixel. In such an embodiment of where the second filter region 122 is formed of a white filter will be used further below for additional explanation of the present invention.

The third filter region 123 may include an infrared blocking filter, for example, which blocks incident light in the infrared wavelength range. In this case, the third filter region 123 can be used to block the incident light in the infrared wavelength range since the above-described solid-state image sensor is highly sensitive to infrared light, resulting in the occurrence of a blurring phenomenon, a change in color, or a fogging effect, for example. Thus, the third filter region 123, along with the second filter region 122, can increase the amount of light that reaches a predetermined pixel, thereby preventing a decrease in the ability to sense an image.

In this case, the second filter region 122 can be used to pass the incident light in all wavelength ranges, and the third filter region 123 can be used to block the infrared wavelength range, so that a corresponding image sensor unit can calculate the infrared wavelength range using the difference, for example, between the wavelength ranges of light that has passed through the second filter region 122 and the third filter region 123.

FIGS. 2A to 2D illustrate differing filter units, according to example embodiments of the present invention.

Figure 2A:
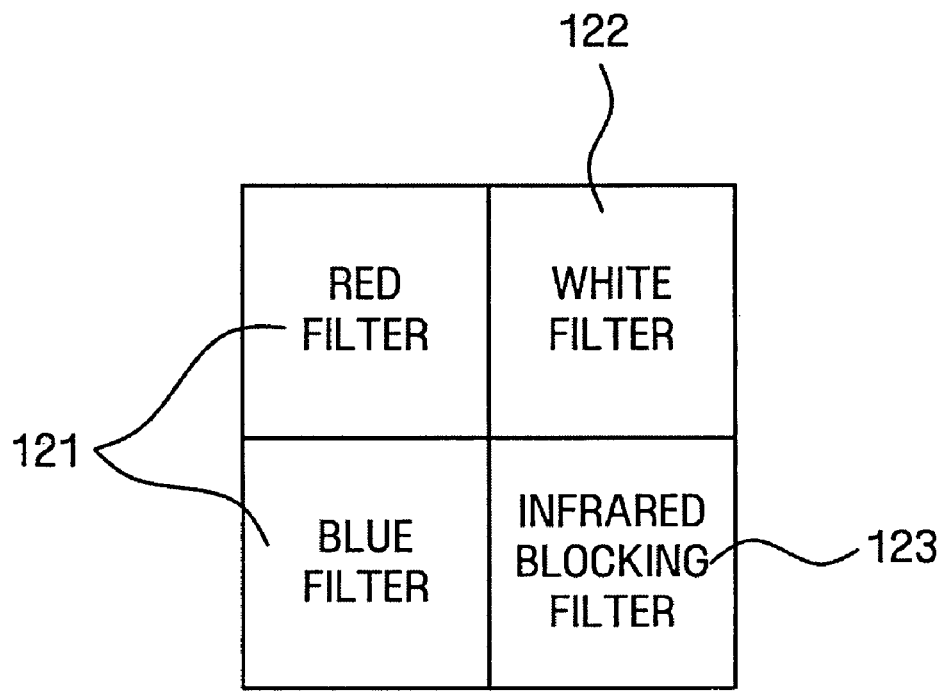
FIGS. 2A to 2D illustrate filter units, according to differing example embodiments of the present invention.
Figure 2B:
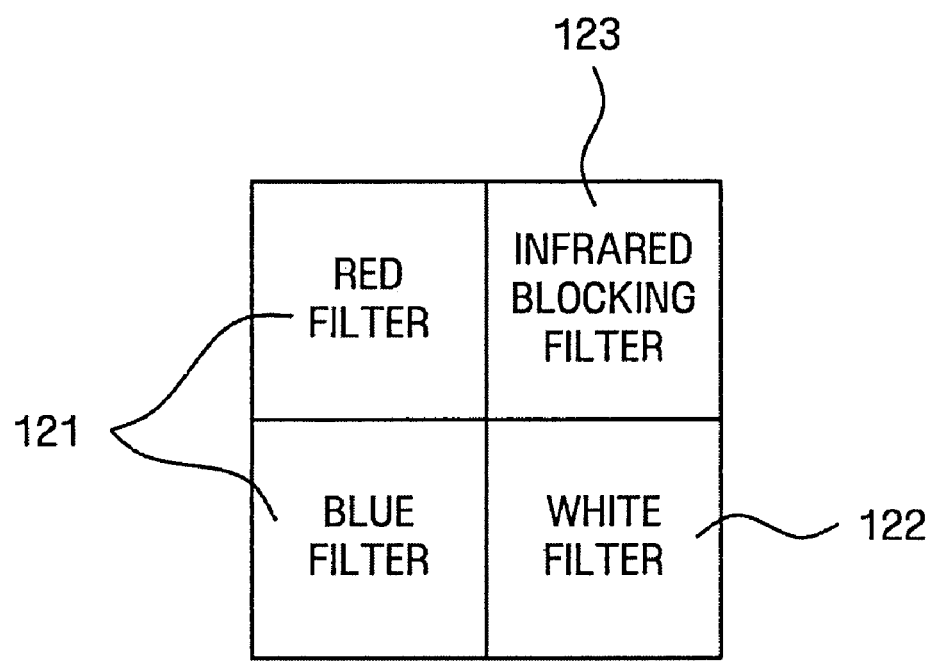
Figure 2C:
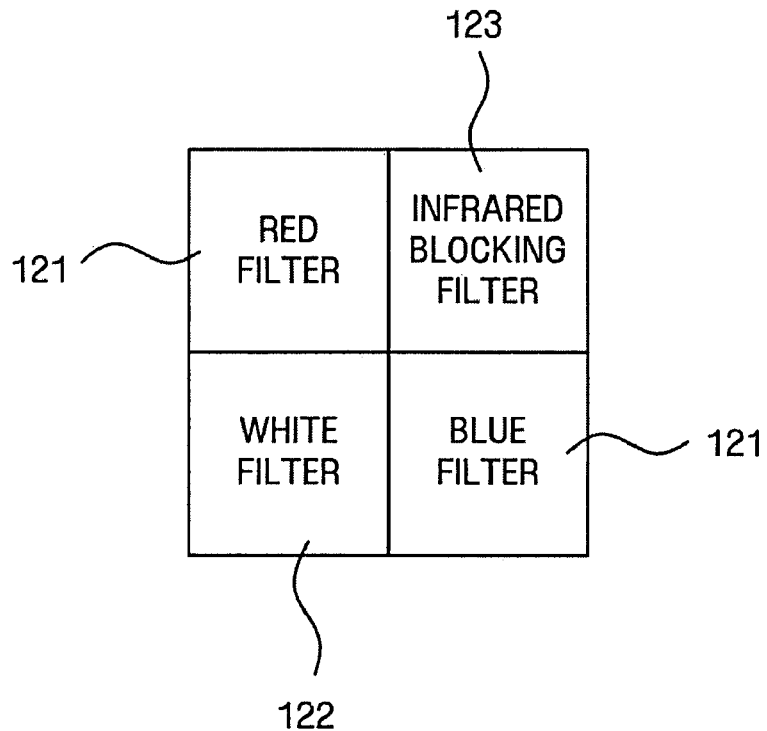
Figure 2D:
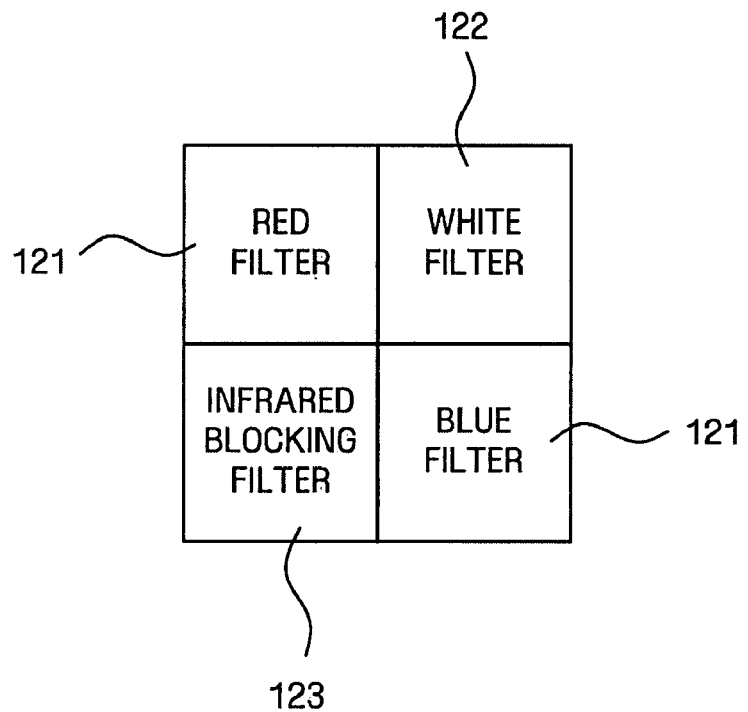

The filter unit 120, according to an embodiment of the present invention, as shown in FIGS. 2A and 2B, may be configured such that a red filter and a blue filter are arranged to be adjacent to each other, and a white filter and an infrared blocking filter are arranged to be adjacent to each other. Similarly, the filter unit 120, as shown in FIGS. 2C and 2D, may be configured such that the red filter is arranged diagonally with respect to the blue filter, and the white filter is arranged diagonally with respect to the infrared blocking filter.

In these cases, the respective filters included in the filter unit 120 may be formed on a pixel basis, for example. Accordingly, in such an embodiment, the red filter, the blue filter, the white filter and the infrared blocking filter may be formed to correspond to respective pixels.

Furthermore, although, in FIGS. 2A and 2B, the filter unit 120 includes four filters, which may respectively correspond to four pixels, in one embodiment, thereby making up a unit region, a plurality of filter units may be used depending on the desired/available resolution of an image. In other word, the filter unit 120 may be expanded in transverse and longitudinal directions in the above-described solid-state image sensor, for example.

Thus, in view of the above, the image sensor unit 130 may sense light passing through the filter unit 120 and generate an image.

Figure 3:
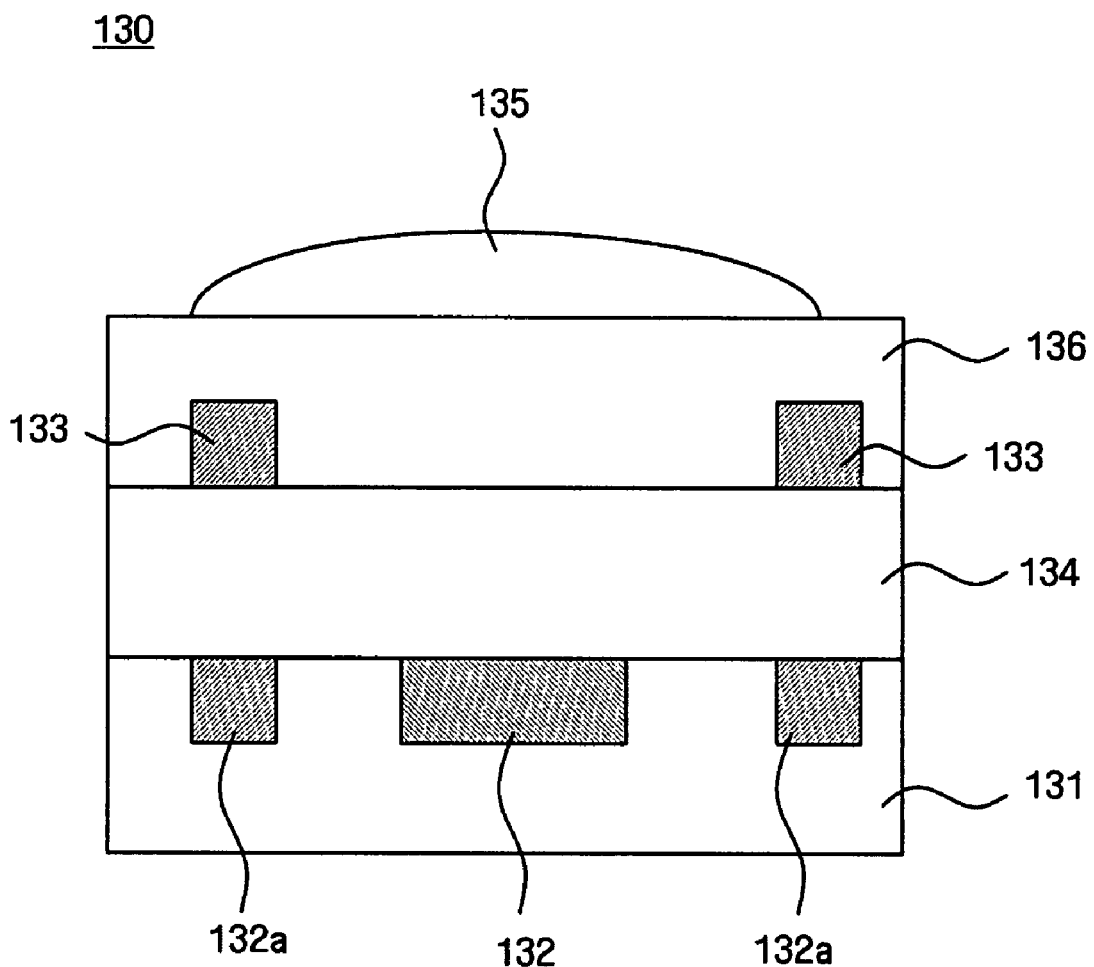
FIG. 3 illustrates an image sensor unit, according to an embodiment of the present invention.

FIG. 3 illustrates an image sensor unit, according to an embodiment of the present invention. The image sensor unit 130 may correspond to a single pixel, for example, and the number of image sensor units may correspond to the number of pixels, noting that alternative embodiments are still available.

As shown in FIG. 3, the image sensor unit 130 may include a substrate 131, a light receiving element 132 formed on the substrate 131, a metal wiring layer 133 formed on the light receiving element 132, a first insulation layer 134 formed between the light receiving element 132 and the metal wiring layer 133, a second insulation layer 136 formed to insulate the metal wiring layer 133, and a microlens 135 formed on the second insulation layer 136 and the metal wiring layer 133.

Depending on embodiment, photo sensors, such as photodiodes, phototransistors or photoconductive elements, may be used for the light receiving element 132. Further, the illustrated isolation films 132a may be formed along sides of the light receiving element 132 to isolate neighboring light receiving elements from each other. In other word, the isolation films 132a are formed to isolate light receiving elements for respective pixels.

The microlens 135 may be used to increase the light sensitivity of the light receiving element 132. Here, the light receiving element 132 may occupy only a portion of the inlet of a single pixel, rather than the overall inlet region. Accordingly, the ratio of the region occupied by the light receiving element 132, for a predetermined pixel region, may typically be smaller than 1. This means that a portion of the incident light is lost. In this case, the micro lens 135 condenses the incident light, so that the amount of light reaching the light receiving element 132 can be increased.

In this case, as noted above, the increase in the number of effective pixels for a CIS having a constant size means that the size of the light receiving element 132 in the image sensor unit 130 described above becomes decreased. When the size of the light receiving element 132 is decreased, the amount of light that reaches the light receiving element 132 is also decreased, therefore the ability to sense an image decreases. Accordingly, the amount of light reaching the light receiving element 132 can be increased by the above mentioned second filter region 122 and the third filter region 123, so that such a decrease in the ability to sense an image can be prevented and, at the same time, high resolution images can be realized.

The image sensor unit 130 may, thus, calculate the infrared wavelength range based on light that has passed through both the white filter and the infrared blocking filter, and eliminate light in the calculated infrared wavelength range from light that has passed through the red filter and the blue filter, so that resultant red and blue light can be obtained while also eliminating the light in the infrared wavelength range.

In more detail, when light passing through the white filter is IWIR, and light passing through the infrared blocking filter is IW, the image sensor unit 130 can calculate the light in the infrared wavelength range IIR using the equation IIR=IWIR−IW, for example. In this case, when light passing through the red filter is IR, the image sensor unit 130 can eliminate the light in the infrared wavelength range from the light IR, resulting in corrected red light IR' being calculated using the equation IR'=IR−IIR. In the case of light passing through the blue filter, there is no infrared wavelength range, thus corresponding correction may not be performed for the infrared wavelength range.

Furthermore, the image sensor unit 130 can obtain white light IW' (the light obtained by eliminating the light in the infrared wavelength range) based on the light in the infrared wavelength range obtained as described above. The white light IW' can be calculated using the equation IW'=(IWIR+IW−IIR)/2, for example. Accordingly, the light in the infrared wavelength range can be eliminated from the light that has passed through the white filter and the infrared blocking filter, and the result can be divided by two, to calculate the average of the white light (without light in the infrared wavelength range) that is simultaneously incident through the white filter and the infrared blocking filter.

Meanwhile, although the image sensor unit 130 has been described as calculating white light IW', e.g., obtained by eliminating the light in the infrared wavelength range, using the equation IW'=(IWIR+IW−IIR)/2, in a high-illuminance state, the light in the infrared wavelength range might not be eliminated in a low-illuminance state, for example, since the contour of a subject is not clear in the low-illuminance state. In other words, the light in a white wavelength range IW' may also be calculated using the equation IW'=(IWIR+IW+IIR)/2) in the low-illuminance state.

The image sensor unit 130 may further adjust white balancing for red and blue light using the above-described white light IW', with further demosaicing based on the interpolation being performed on the white balanced red and blue light. In this case, the demosaiced red light and the demosaiced blue light can be denoted by IR" and IB", respectively, with reference to the above-described white light IW'.

In a further embodiment, the image sensor unit 130 may simplify the process of converting the primary color light, that is, Red (R), Green (G) and Blue (B) light, for example, into chrominance signals YCrCb using the red, blue and white light. Generally, the relationship between the primary color light and chrominance signals is established as follows: Y=aR+bG+cB, Cr=R−Y and Cb=B−Y, such that the white light IW' may be considered luminance Y (Y=IW'), Cr=IR"−IW', and Cb=IB"−IW', thereby simplifying the conversion. Accordingly, color mapping may also be facilitated without using a green filter. Here, even though the green filter is not used, the primary color light can be converted into chrominance signals and, at the same time, the operation is simple compared to the case where all of the primary color filters, that is, red, green, and blue filters, are used.

FIG. 4 illustrates an image capturing method, according to an embodiment of the present invention.

With reference to FIG. 4, when light is incident through a lens, e.g., the lens unit 110, in operation S110, and a filtering may be performed on the light incident on the respective filter regions, e.g., by the filter unit 120, in operation S120. In more detail, operation S120 may be performed in such a way that the filtering limits the incident light to different primary color filtered lights, e.g., by using the two primary color filters of the first filter region 121, in operation S121, incident light in all wavelength ranges may be observed, such as by using a white filter of the second filter region 122, in operation S122, and incident light in the infrared wavelength range may be observed, such as by using an infrared blocking filter of the third filter region 123, in operation S123. Here, although operations S121, S122 and S123, have been described as being performed in a particular order, this is only an example used to promote understanding of the present invention. Operations S121, S122 and S123, described above, may be simultaneously performed, or the order thereof may be changed. Furthermore, in an embodiment of the present invention, the first filter region 121 may include a red filter, which limits the incident light to red light, and a blue filter, which limits the incident light to blue light, with alternate, embodiments being equally available.

An infrared wavelength range may be calculated based on the observed light of all wavelength ranges, e.g., passed through the white filter, and the observed light in the infrared wavelength range, e.g., passed through the infrared blocking filter, in operation S130. For example, when, as described above, the light passing through the white filter is IWIR, and the light passing through the infrared blocking filter is IW, the light in the infrared wavelength range IR can be calculated using the equation IR=IWIR−IW, noting that alternative formulations are also available.

Thereafter, the primary color filtered light may be corrected, e.g., by the image sensor unit 130, based on the calculated infrared wavelength range, in operation S140. For example, light, which has passed through a red filter, can include light in the infrared wavelength range, so that, if the light in the calculated infrared wavelength range is eliminated from the wavelength range of the red light that has passed through the red filter, the red light that has passed through the red filter can be corrected. Meanwhile, the light that has passed through the blue filter may not need corrected, or such a correction operation performed, since filter blue light does not include the infrared wavelength range.

The average of the observed light of all wavelength ranges, e.g., white light based on the light that has passed through the white filter, and observed light in the infrared wavelength range, e.g., light that has passed through the infrared blocking filter, may be further calculated, such as by the image sensor unit 130, in operation S150. In order words, for example, as white light incident through both of the example white filter and infrared blocking filter, light in the infrared wavelength range calculated at operation S130 can also be eliminated from the respective combined white light, and the result divided by two, thereby calculating the average thereof.

Further, white balancing may be adjusted for the red and blue light, which has been corrected based on the average of the white light calculated at operation S150, e.g., by the image sensor unit 130, in operation S160, and demosaicing on the red and blue light based on the average of the white light for each pixel may be performed, in operation S170.

Thereafter, a process, such as gamma correction, on a demosaiced image may be performed, e.g., by the image sensor unit 130, in operation S180, and the gamma-corrected image may be displayed through a display module, in operation S190.

Above, any use of the term 'unit,' means, but is not limited to, a software and/or hardware component, such as a Field Programmable Gate Array (FPGA) or an Application Specific Integrated Circuit (ASIC), which performs certain tasks. The unit may advantageously be configured to reside on an addressable storage medium and be configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables. The operations provided for in the components and units may be combined into fewer components and units or may be further separated into additional components and units.

One or more embodiments of present invention have been described above with reference to a block diagram showing an image capturing device and a flowchart showing an image capturing method. It should, thus, be understood that each block of the flowchart illustration, and combinations of blocks in the flowchart illustration, can be implemented using computer program instructions. These computer program instructions can be provided to a processor of a general purpose computer, a special purpose computer, or other programmable data processing apparatus to produce a machine, such that the instructions, which execute via a processor of the computer or other programmable data processing apparatus, create ways for implementing the operations specified in the flowchart block or blocks.

These computer program instructions may also be stored in a computer-usable or computer-readable memory that can direct a computer or other programmable data processing apparatus to operation in a particular manner, such that the instructions stored in the computer-usable or computer-readable memory produce a manufactured article including instruction mechanism that implement the operation specified in the flowchart block or blocks. The computer program instructions may also be loaded into a computer or other programmable data processing apparatus to cause a series of operations to be performed on the computer or other programmable apparatus to produce a computer-implemented process such that the instructions that are executed on the computer or other programmable apparatus provide operations for implementing the functions specified in the flowchart block or blocks. Further, each block of the flowchart illustrations may represent a module, segment, or portion of code, which includes one or more executable instructions for implementing the specified logical operation(s). It should also be noted that in some alternative implementations, the operations noted in the blocks may occur in differing order. For example, two blocks shown in succession may in fact be executed substantially concurrently, or the blocks may sometimes be executed in reverse order, depending upon the operation involved.

With this in mind, in addition to the above described embodiments, embodiments of the present invention can thus be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as carrier waves, as well as through the Internet, for example. Thus, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

Thus, with one or more embodiments of the present invention, there is an advantage in that the amount of light that reaches a predetermined pixel is increased by using the white filter and the infrared blocking filter, so that the ability to sense an image can be improved.

In addition, in differing embodiments, the white filter may exist between the primary color filters, so that light loss and crosstalk can be reduced.

Further, in differing embodiments, the infrared blocking filter, along with the primary color filters and the white filter, may be used, without a green filter, thereby simplifying the manufacturing process.

Still further, also in differing embodiments, direct conversion may be performed using white, red and blue light without variation in a chrominance signal after the extraction of primary color signals, thereby simplifying signal processing.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An image capturing device, comprising:
   a lens to control incident light;
   a filter unit having a first filter region to limit the incident light, after passing through the lens, to visually observable color light, a second filter region to pass the incident light in wavelength ranges at least beyond the visually observable color light, and a third filter region configured to limit the incident light in an infrared wavelength range; and an image sensor unit configured to sense an image based on light modified by the filter unit with infrared light removal, based on a subtraction of light exiting the second filter region from and addition of light exiting the first filter region and the third fitter region, wherein the first, second, and third regions respectively filter different light incident from the lens.

2. The image capturing device of claim 1, wherein the first filter region limiting of the incident light selectively passes at least one primary color light.

3. The image capturing device of claim 1, wherein the second filter region passes the incident light in all wavelength ranges.

4. The image capturing device of claim 1, wherein the first filter region comprises a plurality of primary color filters to separately limit the incident light to at least two different respective primary colors.

5. The image capturing device of claim 4, wherein the plurality of primary color filters comprise at least two of a red filter, a blue filter, and a green filter.

6. The image capturing device of claim 1, wherein the second filter region comprises a white light filter.

7. The image capturing device of claim 1, wherein the third filter region comprises an infrared blocking filter.

8. The image capturing device of claim 1, wherein the image sensor unit uses sensed aspects of only light exiting the second filter region and the third filter region to calculate an infrared wavelength range of the incident light for the infrared light removal.

9. The image capturing device of claim 8, wherein, in the infrared light removal, the image sensor unit corrects sensed aspects of light exiting the first filter region by eliminating corresponding light aspects in the calculated infrared wavelength range from the sensed aspects of the light exiting the first filter region.

10. An image capturing device, comprising:
a lens to control incident light;
a filter unit having a first filter region to limit the incident light, after passing through the lens, to visually observable color light, a second filter region to pass the incident light in wavelength ranges at least beyond the visually observable color light, and a third filter region to limit the incident light in an infrared wavelength range; and
an image sensor unit to sense an image based on light modified by the filter unit,
wherein the image sensor unit uses sensed aspects of light exiting the second filter region and the third filter region to calculate an infrared wavelength range of the incident light,
wherein the image sensor unit corrects sensed aspects of light exiting the first filter region by eliminating corresponding light aspects in the calculated infrared wavelength range from the sensed aspects of the light exiting the first filter region, and
wherein the image sensor unit modifies the sensed aspects of light exiting the second filter region and the third filter region by eliminating the corresponding light aspects in the calculated infrared wavelength range from the sensed aspects of the light exiting the second filter region and the third filter region, and averages the modified sensed aspects of light exiting the second filter region and the third filter region to calculate a luminance of the incident light.

11. The image capturing device of claim 10, wherein the image sensor unit calculates a chrominance of the incident light based on the corrected sensed aspects of the light exiting the first filter region and the calculated luminance, and senses the image using the calculated luminance and the calculated chrominance.

12. An image capturing device, comprising:
a filter unit having a first filter region to limit incident light to visually observable color light, a second filter region to pass the incident light in wavelength ranges at least beyond the visually observable color light, and a third filter region configured to limit the incident light in an infrared wavelength range; and
an image sensing unit configured to compare a filtered result of the third filter region with at least one filtered result of the first filter region and a filtered result of the second filtered region to output an image having infrared light removal, based on the comparison, and with increased luminance over an image based on only all filtered visually observable color light.

13. An image capturing method, comprising:
filtering light incident to a first filter region to limit incident light to visually observable color light, a second filter region to pass the incident light in wavelength ranges at least beyond the visually observable color light, and a third filter region configured to limit light in an infrared wavelength range; and
sensing an image based on a comparison of separately sensed filtered results of the first, second, and third filter regions, such that the sensed image has infrared light removal, based on the comparison, and increased luminance over an image based on only all filtered visually observable color light.

14. The method of claim 13, further comprising focusing the incident light onto a filtering unit comprising the first, second, and third filter regions.

15. The method of claim 13, wherein the first filter region selectively passes at least one primary color light.

16. The method of claim 13, wherein the second filter region passes the incident light in all wavelength ranges.

17. The method of claim 13, wherein the first filter region comprises a plurality of primary color filters to separately limit the incident light to at least two different respective primary colors.

18. The method of claim 17, wherein the plurality of primary color filters comprise at least two of a red filter, a blue filter, and a green filter.

19. The method of claim 13, wherein the second filter region comprises a white light filter.

20. The method of claim 13, wherein the third filter region comprises an infrared blocking filter.

21. An image capturing method, comprising:
filtering light incident to a first filter region to limit incident light to visually observable color light, a second filter region to pass the incident light in wavelength ranges at least beyond the visually observable color light, and a third filter region to limit light in an infrared wavelength range; and
sensing an image based filtered results of the first, second, and third filter regions, wherein the sensing the image comprises:
sensing aspects of light exiting the second filter region and the third filter region, and calculating an infrared wavelength range of the incident light based on the sensed aspects of the light exiting the second filter region and the third filter region;

correcting sensed aspects of light exiting the first filter region by eliminating corresponding light aspects in the calculated infrared wavelength range from the sensed aspects of the light exiting the first filter region;

modifying the sensed aspects of light exiting the second filter region and the third filter region by eliminating the corresponding light aspects in the calculated infrared wavelength range from the sensed aspects of the light exiting the second filter region and the third filter region;

calculating a luminance of the incident light by averaging the modified sensed aspects of light exiting the second filter region and the third filter region;

calculating a chrominance of the incident light based on the corrected sensed aspects of the light exiting the first filter region and the calculated luminance; and sensing an image using the calculated luminance and the calculated chrominance.

22. An image capturing method, comprising:

filtering an incident light, comprising limiting incident light to visually observable color light by a first filter region, passing the incident light in wavelength ranges at least beyond the visually observable color light by a second filter region, and limiting the incident light in an infrared wavelength range by a third filter region; and generating and outputting an observed image by comparing a filtered result of the third filter region with at least one filtered result of the first filter region and a filtered result of the second filtered region, with the generated observed image having infrared light removal and an increased luminance over an image based on only all filtered visually observable color light.

23. An image capturing device, comprising:

a lens to control incident light;

a filter unit having a first filter region to limit the incident light, after passing through the lens, to visually observable color light, a second filter region to pass the incident light in wavelength ranges at least beyond the visually observable color light, and a third filter region to limit the incident light in an infrared wavelength range; and an image sensor unit to sense an image based on light modified by the filter unit, with the sensing of the image including at least averaging modified sensed aspects of light exiting the second filter region and sensed aspects of light exiting the third filter region and calculating a luminance of the incident light for modifying sensed aspects of light exiting the first filter region.

24. An image capturing device, comprising:

a lens to control incident light;

a filter unit having a first filter region to limit the incident light, after passing through the lens, to visually observable color light, a second filter region to pass the incident light in wavelength ranges at least beyond the visually observable color light, and a third filter region configured to limit the incident light in an infrared wavelength range; and an image sensor unit configured to sense an image based on the image sensor sensing respective distinct aspects of light exiting the first filter region, exiting the second filter region, and exiting the third filter region of the filter unit, such that the sensed image has infrared light removal, based on a comparison of a least the respective light exiting the second filter region and the third filter region, and increased luminance over an image based on only all filtered visually observable color light.

25. The image capturing device of claim 1, wherein the image sensor unit is configured to selectively sense the image based on the light modified by the filter unit with the infrared light removal and based on the light modified by the filter unit without the infrared light removal.

26. The image capturing device of claim 12, wherein the image sensing unit is configured to selectively perform the infrared light removal by selectively comparing the filtered result of the third filter region with the filtered result of the second filtered region.

27. The image capturing method of claim 13, wherein the sensing of the image includes selectively performing the infrared light removal by selectively comparing the filtered result of the third filter region with the filtered result of the second filtered region.

28. The image capturing method of claim 22, wherein the sensing of the image includes selectively performing the infrared light removal by selectively comparing the filtered result of the third filter region with the filtered result of the second filtered region.

29. The image capturing device of claim 24, wherein the image sensor unit is configured to selectively perform the infrared light removal by selectively comparing the filtered result of the third filter region with the filtered result of the second filtered region.

* * * * *

UNITED STATES PATENT AND TRADEMARK OFFICE
CERTIFICATE OF CORRECTION

| | | |
|---|---|---|
| PATENT NO. | : 8,068,159 B2 | Page 1 of 1 |
| APPLICATION NO. | : 11/785560 | |
| DATED | : November 29, 2011 | |
| INVENTOR(S) | : Won-hee Choe et al. | |

It is certified that error appears in the above-identified patent and that said Letters Patent is hereby corrected as shown below:

First Page Column 1 Item 54 (Title), Delete "THORUGH" and insert -- THROUGH --, therefor.

First Page Column 1 Item 75 (Inventors), Delete "Gyeongiu-si" and insert -- Gyeongju-si --, therefor.

Column 1, Line 2, Delete "THORUGH" and insert -- THROUGH --, therefor.

Signed and Sealed this
Twenty-eighth Day of February, 2012

David J. Kappos
*Director of the United States Patent and Trademark Office*